United States Patent
Boyce et al.

(10) Patent No.: US 7,151,754 B1
(45) Date of Patent: Dec. 19, 2006

(54) COMPLETE USER DATAGRAM PROTOCOL (CUDP) FOR WIRELESS MULTIMEDIA PACKET NETWORKS USING IMPROVED PACKET LEVEL FORWARD ERROR CORRECTION (FEC) CODING

(75) Inventors: Jill M. Boyce, Manalapan, NJ (US); Haitao Zheng, Eatontown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 1047 days.

(21) Appl. No.: 09/668,242

(22) Filed: Sep. 22, 2000

(51) Int. Cl.
*H04Q 7/00* (2006.01)
(52) U.S. Cl. .................. 370/328; 370/469; 714/746
(58) Field of Classification Search ............... 370/209, 370/211, 235, 277, 315, 317, 319, 332, 333, 370/389, 392, 394, 456, 466, 469
See application file for complete search history.

(56) References Cited

U.S. PATENT DOCUMENTS

| | | | |
|---|---|---|---|
| 6,148,422 A * | 11/2000 | Strawczynski et al. | 714/704 |
| 6,208,620 B1 * | 3/2001 | Sen et al. | 370/231 |
| 6,377,799 B1 * | 4/2002 | Hameleers et al. | 370/466 |
| 6,430,233 B1 * | 8/2002 | Dillon et al. | 375/316 |
| 6,530,055 B1 * | 3/2003 | Fukunaga | 714/746 |
| 6,542,490 B1 * | 4/2003 | Ahmadvand et al. | 370/338 |
| 6,571,212 B1 * | 5/2003 | Dent | 704/270.1 |
| 6,591,382 B1 * | 7/2003 | Molloy et al. | 714/704 |
| 6,651,214 B1 * | 11/2003 | Weng et al. | 714/771 |
| 6,697,352 B1 * | 2/2004 | Ludwig et al. | 370/466 |
| 6,718,500 B1 * | 4/2004 | Lee et al. | 714/746 |
| 2002/0054578 A1 * | 5/2002 | Zhang et al. | 370/328 |

OTHER PUBLICATIONS

Larzon, Lars-Ake et al. "Efficient Use of Wireless Bandwidth for Multimedia Applications". Mobile Multimedia. Communications. 1999 IEEE International Workshop on Nov. 15-17, 1999, pp. 187-193.*

Singh, Amoolya "Networking Protocols for Wireless Multimedia Streaming" University of California at Berkeley, May 19, 2000, pp. 1-26.*

* cited by examiner

*Primary Examiner*—Chi Pham
*Assistant Examiner*—Anh-Vu Ly

(57) ABSTRACT

A complete User Datagram Protocol (CUDP) is disclosed that reduces packet loss. Channel frame error information is used with a packet level forward error correction (FEC) coding technique to accommodate wireless multimedia traffic. Each packet, as well as the channel frame error information, is forwarded to a given application. The CUDP protocol further assists the FEC decoding process by forwarding the locations of corrupted frames to the FEC decoder. Maximal Distance Separable (MDS) codes can be applied to a group of packets, to achieve additional robustness. An MDS decoder utilizes the frame error information to recognize the erasures within each packet. The error information can be represented as a set of LTU error indicators associated with each packet (for FEC decoders requiring an erasure indicator). The error indicators point to the starting and ending location of the erroneous data. The error information can also be represented as a reformatted packet (for FEC decoders Recognizing Erasures). The frame (LTU) error information from the lower layers is incorporated in the packet payload. An FEC encoder is also disclosed that encodes multimedia packets utilizing a packet-coding scheme, such as a Vertical Packet Coding (VPC) scheme or a Long Vertical Packet Coding (LVPC) scheme.

44 Claims, 4 Drawing Sheets

COMPLETE USER DATAGRAM PROTOCOL (CUDP) FOR WIRELESS MULTIMEDIA PACKET NETWORKS USING IMPROVED PACKET LEVEL FORWARD ERROR CORRECTION (FEC) CODING

CROSS-REFERENCE TO RELATED APPLICATION

The present invention is related to U.S. patent application Ser. No. 09/668,243 entitled "Radio Link Protocol (RLP)/Point-to-Point Protocol (PPP) Design for Wireless Multimedia Packet Networks that Passes Corrupted Data and Error Location Information Among OSI Layers," filed contemporaneously herewith, assigned to the assignee of the present invention and incorporated by reference herein.

FIELD OF THE INVENTION

The present invention relates generally to wireless packet networks, and more particularly, to methods and apparatus for reducing lost or corrupted packets in such wireless packet networks.

BACKGROUND OF THE INVENTION

It is inevitable that future wireless services will support Internet Protocol (IP)-based multimedia applications. For example, current and emerging wireless networks allow (i) a user to download information from the Internet using a wireless communication device, (ii) Internet-to-mobile or mobile-to-mobile videoconferences, (iii) streaming of video or audio information (or both) from the Internet to a wireless communication device, and (iv) electronic-commerce applications. In general, the multimedia services can be classified into two categories. Real-time services generally have delay constraints but can tolerate channel errors, and include interactive services, such as voice, voice-over-IP, packet video/audio, videoconference applications. Non-real-time services, on the other hand, are generally sensitive to channel errors but have more relaxed latency requirements, and include Web browsing, electronic mail and file transfer protocol (FTP) applications. It is noted, however, that non-real-time services for wireless systems should still provide a reasonable level of latency in order to be compatible with performance on a wired network, such as the Internet.

The end-to-end path of many wireless multimedia sessions, such as an Internet-to-mobile communication, involves a number of heterogeneous network technologies, with the multimedia packets being sent from an originating server, through the Internet and then over one or more wireless packet networks to the mobile destination. Network congestion on the Internet leads to packet loss and degraded quality. Thus, most Internet-based real-time multimedia services employ the well-known User Datagram Protocol (UDP) as their transport protocol. Compared to the Transmission Control Protocol (TCP), the UDP protocol has low overhead and no retransmission delay, which makes it attractive to delay sensitive applications.

A UDP packet typically includes a header, containing source and destination address information, as well as a payload (the actual application data). The UDP protocol employs a cyclic redundancy check (CRC) to verify the integrity of packets, in a known manner. The UDP protocol can detect any error in the packet header or payload and discard the packet if an error is detected. Packet transmission based on the UDP protocol on the Internet is a "best efforts" protocol, where network congestion yields packet loss. When a packet fails to arrive before its processing time, the UDP protocol declares the packet as lost. Therefore, at the receiving host, packets are either perfect or completely lost.

Wireless packet networks encounter packet losses between a base station and a mobile receiver as a result of channel errors and network congestion. Furthermore, such packet losses can be random or bursty, depending on the environment, rate-of-motion and network loading. Therefore, it has been recognized that use of the UDP protocol in a wireless network will cause considerable packet losses, and as a result, poor audio/video quality and increased power consumption. The inefficiency of the UDP protocol in wireless networks arises from the discarding of a packet containing only a small portion of corrupted data. As such, the UDP protocol also discards error-free data within the packet. Indeed, current and emerging multimedia coding technologies are focusing on improved error resilience, such that the media decoder can tolerate a certain number of channel errors. Thus, a need exists for a revised UDP protocol that reduces or avoids unnecessary packet discarding.

When wireless channels have a fairly high bit error rate, packet-level forward error correction (FEC) coding techniques, such as those described in R. Blahut, Theory and Practice of Error Control Codes (Addison-Wesley, 1983), provide an effective way to mitigate channel unreliability and improve media quality. Typically, FEC techniques apply Maximal Distance Separable (MDS) codes, such as Reed-Solomon (RS) codes, across the packets to recover lost packets. Generally, an FEC encoder typically chooses k information packets and generates n-k parity packets of length n to construct an (n, k) RS code. For IP transmission, the packets are numbered and are assumed to arrive perfectly or never arrive at all. The missing packets can be detected by the receiver and declared as erasure packets. An (n, k) RS code can correct (n-k) erasures and thus recover up to (n-k) packet losses.

In a wireless network employing the UDP protocol, an FEC decoder would use only the packets that were received perfectly, and lost packets are considered erasures. However, the UDP protocol yields high packet loss rates even under low and medium physical layer data losses. Therefore, the (n-k) value employed by the FEC encoder should be sufficiently large to effectively reduce the packet loss, which implies increased overhead and less efficiency. On the other hand, in a wireless network employing the UDP Lite protocol, which performs a checksum based on the packet header, so that only corrupted packet headers result in packet loss, the FEC decoder may receive perfect or corrupted packets, and performs both error and erasure correction. Since MDS codes provide twice the erasure recovering capability compared to error correction capability, an (n, k) packet code can recover up to (n-k)/2 erroneous packets within every n packets.

SUMMARY OF THE INVENTION

We have recognized that the above-described shortcomings of the UDP protocol may be overcome by a revised UDP protocol, referred to herein as the complete User Datagram Protocol (CUDP), that reduces unnecessary packet discarding.

More specifically, we have developed the CUDP that includes new packet handling procedures and reduces unnecessary packet discarding. The disclosed CUDP protocol utilizes channel frame error information obtained from the physical and link layers to assist the packet level error recovery. In addition, the CUDP supports packet level FEC coding in order to reduce information loss.

The present invention forwards each packet, as well as the channel frame error information, to a given application. In particular, the disclosed CUDP protocol further assists the packet level FEC decoding process by forwarding the locations of corrupted frames to the FEC decoder. A transmitter in accordance with the present invention optionally applies FEC techniques employing Maximal Distance Separable (MDS) codes to a group of packets, to achieve robustness against packet loss within the Internet and against packet error over wireless channels. At the receiver, the CUDP protocol forwards the frame error information, as well as the packet data, to the application layer. An MDS decoder utilizes the frame error information to recognize the erasures within each packet.

The error information provided to the application layer can be represented in a number of forms. Upon receiving a packet, the CUDP protocol only performs a packet header CRC check (and not a payload CRC check). In one implementation, a set of logical transmission unit (LTU) error indicators associated with each packet is provided to the application layer (for FEC decoders requiring an erasure indicator). If the packet header is valid, the UDP layer forwards the indicator, the LTU size and the packet payload to the FEC decoder. In another implementation, a reformatted packet is provided to the application layer (for FEC decoders Recognizing Erasures). The frame (LTU) error information from the lower layers is incorporated in the packet payload. In this case, if a physical frame is corrupted, the payload within the frame is represented as a set of erasures, which can be recognized by the FEC decoder. For a valid packet header, the CUDP protocol passes the reformatted packet payload to the upper layers. An FEC encoder is also disclosed that encodes multimedia packets utilizing a packet-coding scheme.

DETAILED DESCRIPTION

Figure 1:
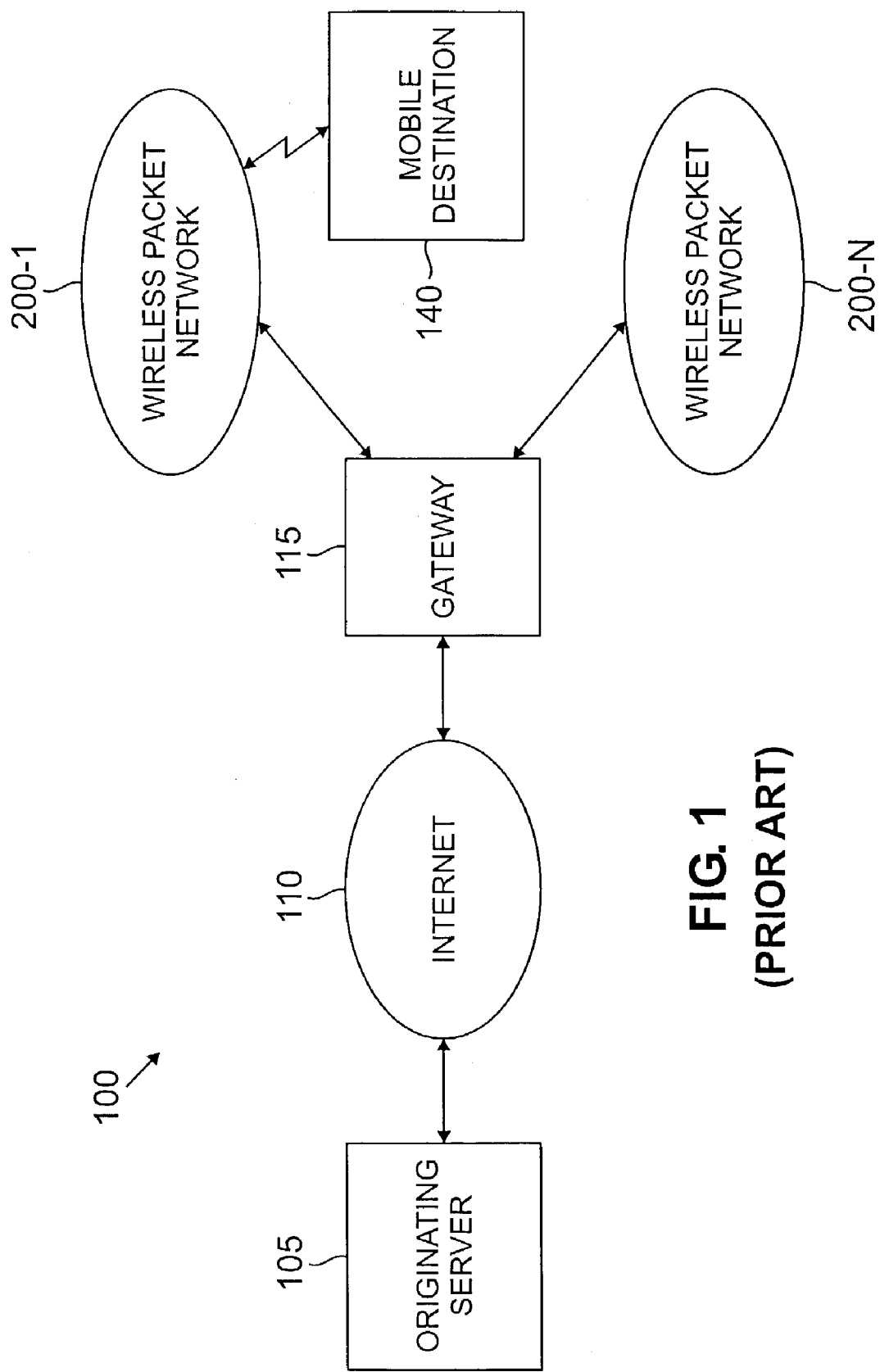
FIG. 1 illustrates a conventional multimedia network environment.
Figure 2:
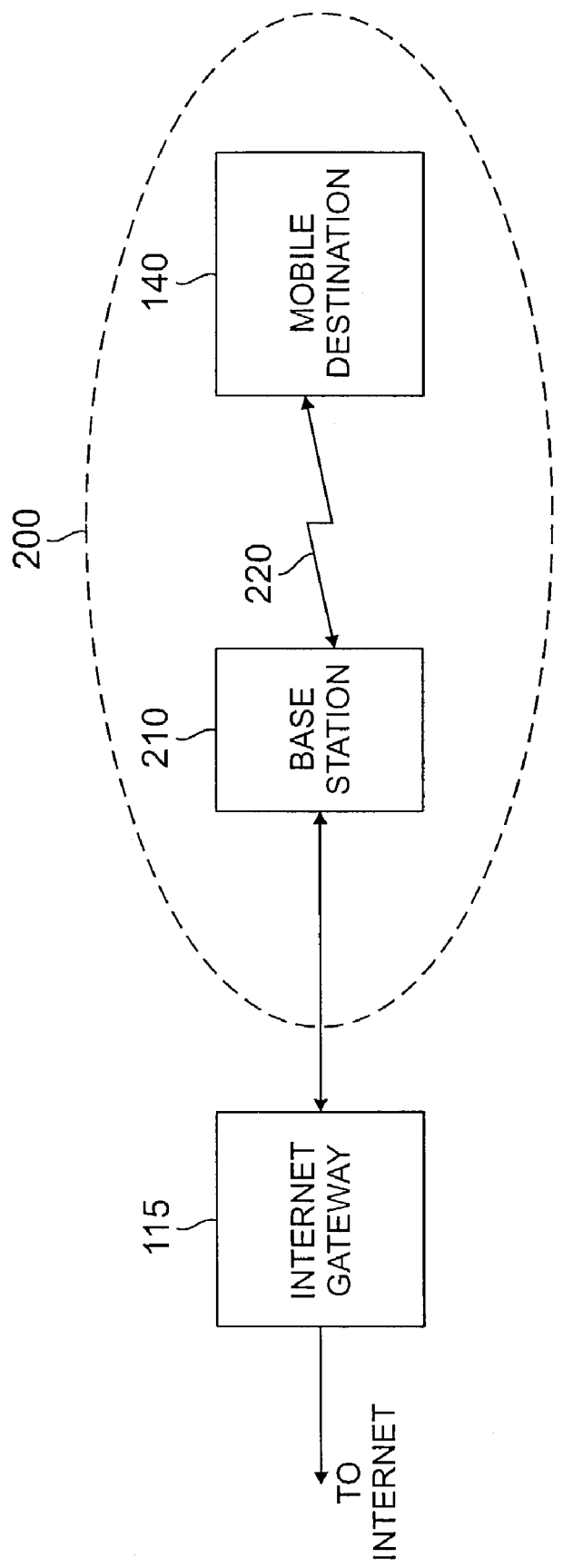
FIG. 2 illustrates a conventional wireless packet network of FIG. 1 in further detail.

FIG. 1 illustrates a conventional heterogeneous network environment 100 that supports IP-Wireless multimedia communications. As shown in FIG. 1, the end-to-end path of many wireless multimedia sessions, such as an Internet-to-mobile communication, involves a number of heterogeneous network technologies, with the multimedia packets being sent from an originating server 105, through the Internet 110 and then over one or more wireless packet networks 200-n, shown in further detail in FIG. 2, to the mobile destination 140.

UDP and FEC In Wireless Packet Networks

Figure 3:
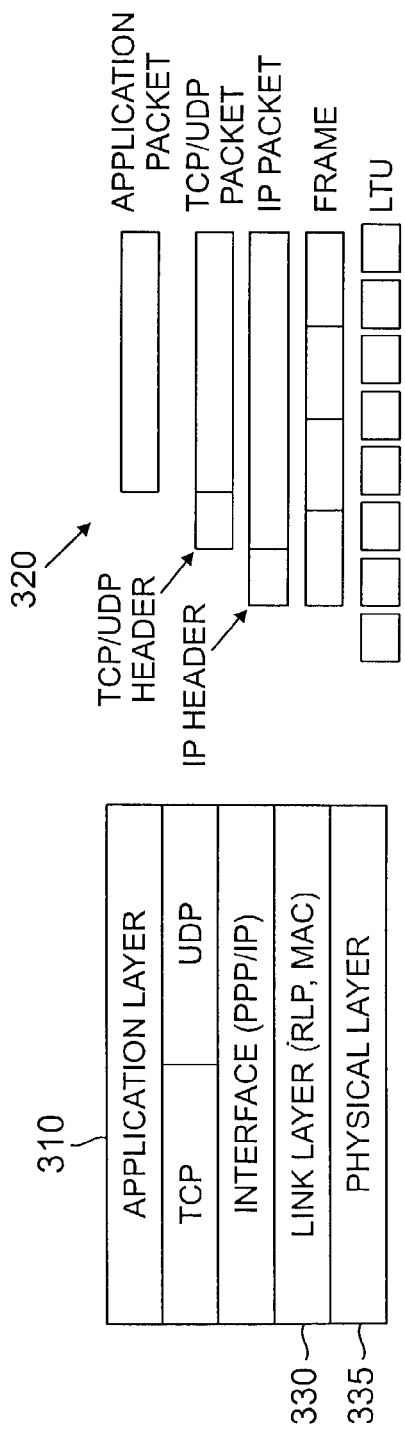
FIG. 3 illustrates a conventional wireless protocol stack and packet structure in accordance with the present invention.

FIG. 3 illustrates a general wireless protocol stack 310 and packet structure 320. The link layer 330 partitions each single data packet into multiple units to accomplish physical layer transmission. The unit size depends on the radio link protocol (RLP), medium access control (MAC) and physical layer (PHY) 335, but is usually much smaller than the packet size. In 3G wireless systems, for example, each physical layer frame corresponds to a transmission unit, assuming low and medium data rates. To support high data rate services, the MAC layer specifies that the RLP layer can subdivide each physical layer frame into smaller logical frames, referred to as LTUs, each associated with a 16 bit CRC. Typical LTU size ranges from 300–600 bits (40–80 bytes), while IP packets are typically 600–1500 bytes long.

At the receiver 140, the RLP can specify a limited number of retransmissions to compensate for LTU losses. The RLP forwards the received LTUs to the interface, e.g., Point-to-Point Protocol, to reconstruct the packet. For non-real-time services, PPP forwards the packets to the TCP layer, where the packet losses after RLP retransmissions can be recovered at the TCP level through packet level retransmission and congestion control. For real-time services employing UDP, upon receiving a packet from the PPP protocol layer, the conventional UDP layer performs a packet level cyclic redundancy check(CRC) to validate the information within the packet, including both the packet header and the payload. In this case, any LTU loss would result in the whole packet being discarded. Mathematically, the packet loss rate (PER) can be approximated as:

$$PER=1-(1-p)^m \sim mp \text{(for large } m \text{ and small } p),$$

where m is the number of LTUs per packet and p is the LTU error rate (LER) after retransmission. Therefore, using a conventional UDP in a wireless network will yield a considerable amount of packet loss, and as a result, poor video/audio quality and increased power consumption. The inefficiency of UDP in wireless networks arises from the discarding of a packet containing only a small part of corrupted data. As such, the UDP also throws out error-free data within the packet. Indeed, applications can utilize error-free data to recover corrupted data.

The reliable UDP (RUDP) was proposed to provide reliable ordered delivery of packets up to a maximum number of retransmissions for virtual connections. For a more detailed discussion of RUDP, see, T. Bova and T. Krivoruchk, "Reliable UDP Protocol", Internet Draft, Network Working Group, <draft-ietf-sigtran-reliable-udp-00.txt>, incorporated by reference herein. Generally, the RUDP protocol calculates the CRC checksum on the packet header alone or the packet header and the payload. This flexibility makes the RUDP protocol suitable for transport telecommunication signaling.

Similarly, the UDP Lite protocol was proposed to prevent unnecessary packet loss at the receiver if channel errors occur only in the packet payload. For a more detailed discussion of the UDP Lite protocol, see, L. Larzon et al., "Efficient Use of Wireless Bandwidth for Multimedia Applications," 187–193, MoMuc 99, San Diego (November 1999), incorporated by reference herein. The UDP checksum is constructed based on the packet header, so that only corrupted packet headers result in packet loss. The UDP Lite protocol delivers the packet payload to the upper layers, whether the payload is perfect, lost or erroneous. Compared to UDP, UDP lite only performs CRC on the packet header.

Therefore, if corrupted, a packet payload will not result in the packet being discarded. However, the error location within the packet payload is unknown to the application, which can improve packet level FEC performance.

When wireless channels have a fairly high bit error rate, packet-level forward error correction (FEC) coding techniques, such as those described in R. Blahut, Theory and Practice of Error Control Codes (Addison-Wesley, 1983), provide an effective way to mitigate channel unreliability and improve media quality. These FEC techniques are currently being considered by the Internet Engineering Task Force (IETF) for supporting real-time multimedia communications on the Internet and over wireless networks. See, for example, D. Budge et al., "Media-Independent Error Correction Using RTP," Internet Engineering Task Force Internet Draft (May 1997); S. Wenger and G. Cĉôté, "Using RFC2429 and H.263+ At Low To Medium Bit-Rates For Low-Latency Applications," Packet Video '99, New York, N.Y., USA (April 1999); M. Gallant and F. Kossentini, "Robust and Efficient Layered H.263 Internet Video Based on Rate-Distortion Optimized Joint Source/Channel Coding", Packet Video '00 (Italy, 2000); S. Wenger and G. Côté, "Test Model Extension Justification for Internet/H.323 Video Transmission", Document Q15-G-17, ITU Q15, Video Coding Experts Group (February 1999); and J. Rosenberg and H. Schulzrinne, "An RTP Payload Format For Generic Forward Error Correction," Internet Draft, February 1999, available from http://info.internet.isi.edu:80/in-drafts/files/draft-ietf-avt-fec-05.txt, each incorporated by reference herein.

Complete UDP

As previously indicated, the UDP and UDP Lite protocols do not perform well with packet based FEC. One significant reason is that the UDP and UDP Lite protocols ignore useful channel information from the RLP layer 330. The present invention recognizes that such information can be exploited to maximize FEC coding efficiency. However, the current protocol design does not support information communications from the RLP layer 330 to the PPP/IP/UDP layers and above. The present invention proposes a new system protocol design that allows the exchange of certain information in both directions among the layers 310. For a more detailed discussion of communications between the RLP and PPP layers in the conventional open system interconnection (OSI) model, see co-pending U.S. patent application Ser. No. 09/668,243 entitled "Radio Link Protocol/Point-to-Point Protocol Design for Wireless Multimedia Packet Networks that Passes Corrupted Data and Error Location Information Among OSI Layers," incorporated by reference above. A revised UDP protocol, referred to herein as the complete User Datagram Protocol (CUDP), is disclosed that reduces or avoids the discarding of unnecessary packets by passing the LTU error information as well as the corrupted packets to the Packet FEC decoder. Depending on the implementation of the FEC decoder, the error information can be represented in two forms:

LTU Error Indicator: (For FEC Decoders Requiring Erasure Indicator)

Upon receiving a packet, the UDP protocol only performs a packet header CRC check (and not a payload CRC check), in a similar manner to the UDP Lite protocol. The LTU error information obtained from the lower layers is represented in terms of a set of error indicators that are associated with each packet. The error indicators point to the starting and ending location of the erroneous data. If the packet header is valid, UDP forwards the indicator, the size of LTU as well as the packet payload to the FEC decoder.

Reformatted Packet:(For FEC Decoders Recognizing Erasures)

Upon receiving a packet, the UDP protocol performs a packet header CRC check. The LTU (referred to herein as "frame") error information from the lower layers is incorporated in the packet payload. In this case, if a physical frame is corrupted, the payload within the frame is represented as a set of erasures, which can be recognized by the FEC decoder. The erasure format depends on the system implementation. Under a valid packet header, UDP passes the reformatted packet payload to the upper layers. The proposed UDP protocol captures all of the available information, i.e., the error-free frames and the location of erroneous frames.

Packet Based FEC Coding Scheme

According to another aspect of the present invention, an FEC coding technique is disclosed that uses the available wireless frame error information. Conventional MDS codes were designed for Internet multimedia applications, where packet loss is congestion related. For wireless multimedia applications, most packets are partially damaged by channel errors. Thus, if a conventional UDP protocol was utilized, such partially damaged wireless packets would be discarded. Similarly, if a conventional UDP Lite protocol was utilized, such partially damaged wireless packets are forwarded to the application, but the location of the error is discarded, thereby leading to information loss.

Figure 4:
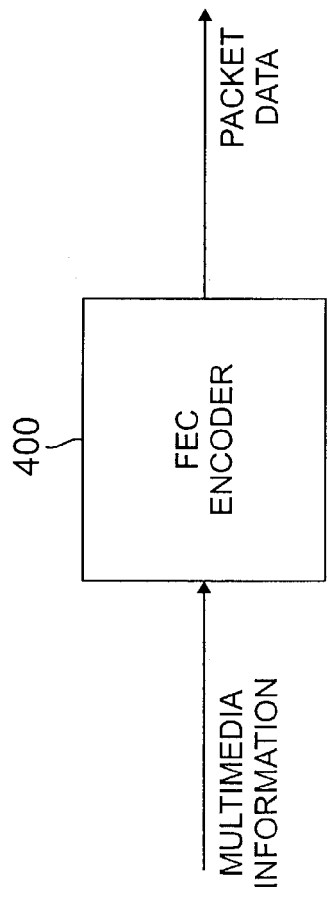
FIG. 4 illustrates a packet-level forward error correction (FEC) coder in accordance with the present invention.
Figure 5A:
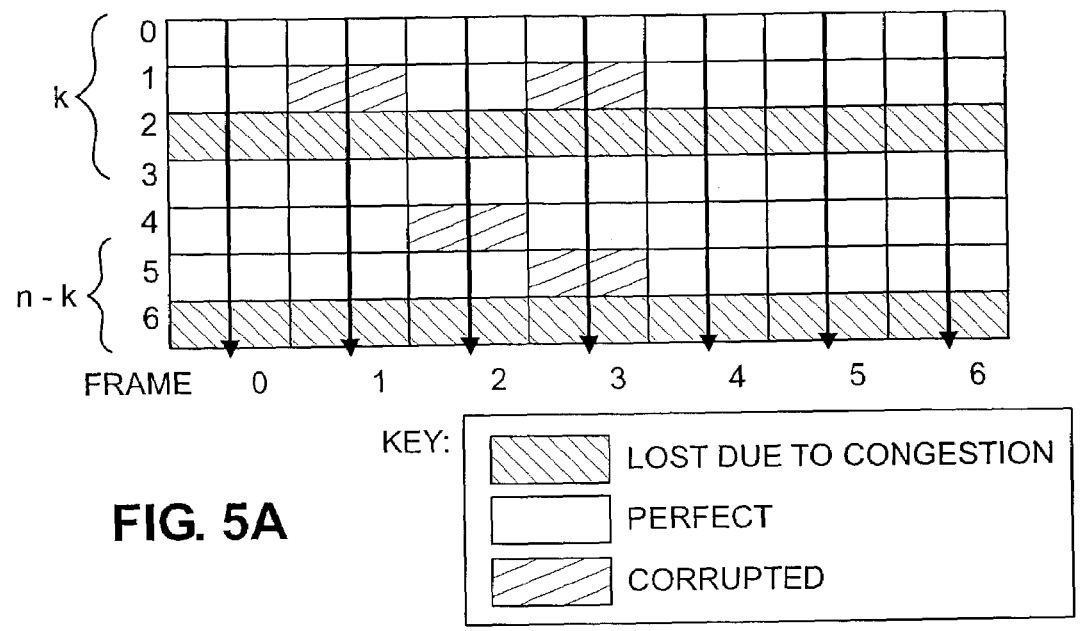
FIGS. 5A and 5B illustrate a vertical packet coding (VPC) scheme and a long vertical packet coding (LVPC) scheme, respectively, employed by the FEC coder of FIG. 4 in accordance with the present invention.

FIG. 4 illustrates an FEC coder 400 in accordance with the present invention that encodes multimedia packets utilizing one of two illustrative packet-coding schemes, discussed further below in conjunction with FIGS. 5A and 5B. The illustrative FEC encoder 400 codes every four packets together, and generates three parity checks. Thus, a (7,4) MDS code is employed in the illustrative embodiment. At the wireless physical layer, each packet is segmented into seven frames.

Vertical Packet Coding (VPC) Scheme

The FEC encoder 400 selects k packets of length X units. The proposed system encodes multiple packets of the same size together. For real-time applications, the packets should have the same or similar delay constraint, e.g., packets correspond to a single video frame. The packets can be of different length. If so, they are bit stuffed to match the longest packet length. Indeed, the source coding and packetization scheme can be designed to generate packets with equal or similar size, as described in co-pending U.S. patent application Ser. 09/668,243 entitled "Radio Link Protocol/Point-to-Point Protocol Design for Wireless Multimedia Packet Networks that Passes Corrupted Data and Error Location Information Among OSI Layers,", incorporated by reference above. The channel encoder at the application layer takes one data unit from each packet and generates (n−k) parity units to construct (n−k) additional packets in a vertical packet coding (VPC) structure, shown in FIG. 5A.

The VPC scheme provides transparent Internet-to-Wireless communications. In this case, the transmitter at the Internet multimedia database 105 is unaware of the wireless network 200 further downstream, and performs the same coding scheme to support packet flows over the Internet or a wireless network. On the other hand, for a Wireless-to-Internet packet flow, the gateway 115 between these two networks should embed the frame error information in the packet, and forward it to the receiver. Another option would be for the gateway to perform packet FEC decoding based on the frame error information. The gateway 115 discards any packet with an unrecoverable frame error without sending it to the Internet 110. As such, the UDP protocol within the Internet remains unchanged. However, this action increases both computational complexity and transmission delay at the gateway 115.

Another advantage of the CUDP with VPC of the present invention is that even if the decoder fails, part of the erroneous packets can still be recovered. Using the scenario in FIG. 5A, packet 1, 2, 4, 5, 6 are declared lost if only the packet CRC check is used to validate the data. A (7,4) MDS code can only recover three (3) erasures (7 minus 4). Therefore, without the frame error information, the conventional decoder will fail. If the frame error information is available, the erasures at columns 0, 1, 2, 4, 5, 6 are recovered. Only the column corresponding to frame 3 contains erasure. For compressed multimedia data, this is more important since more information means better error concealment and recovery. If using a UDP Lite protocol, on the other hand, a (7,4) MDS code can recover one error and one erasure, or three erasures; therefore it can only recover columns 0, 4, 5 and 6.

Long Vertical Packet Coding (LVPC) Scheme (n, k) MDS codes achieve better error/erasure correction efficiency as n increases, for the same redundancy ratio (n−k)/n. The FEC encoder 400 can increase n by coding L multiple columns of data units together. This generates X/L coded streams, each corresponding to a (nL, kL) MDS codes. This coding scheme is referred to as long vertical packet coding (LVPC), shown in FIG. 5B.

Figure 5B:
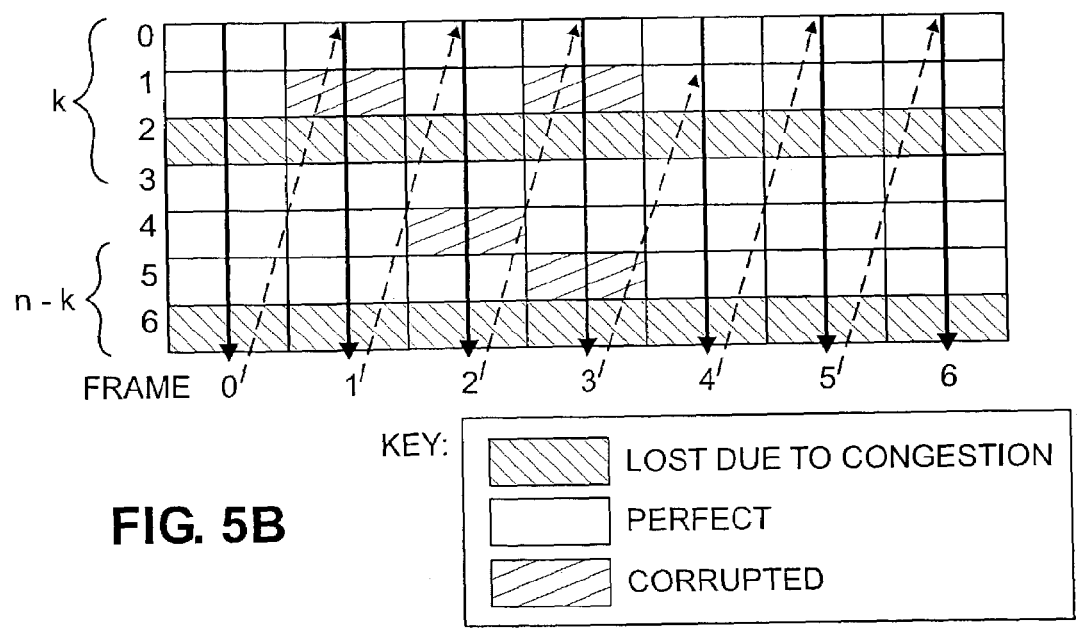

Using the scenario shown in FIG. 5B, and assuming L=m=7, the dimension of the MDS code is (49,28) which can recover 21 erasures. From FIG. 5B, the channel error and congestion yields 19 erasures that can all be recovered. LVPC achieves higher efficiency compared to VPC. However, if the decoder fails in LVPC, all the erasures can not be recovered, while in VPC, part of the erasures can be recovered. In addition, compared to VPC, LVPC has a disadvantage of increased computational complexity for the IP-only case since it requires the wireless frame size information, which may not be available at the transmitter.

Horizontal/Vertical Packet Coding (HVPC) Scheme

In a further variation, FEC coding is applied to code the wireless frames in a single packet. As such, the encoder 400 applies vertical packet coding across the packets, and then applies an outer horizontal coding scheme within each packet. Similarly, the decoder first performs horizontal decoding to recover frame errors within the same packets, and then performs vertical decoding. The horizontal packet coding requires knowledge of the frame size.

It is to be understood that the embodiments and variations shown and described herein are merely illustrative of the principles of this invention and that various modifications may be implemented by those skilled in the art without departing from the scope and spirit of the invention.

The invention claimed is:

1. A method for processing multimedia data in a User Datagram Protocol layer of a wireless receiver conforming to an Internet Protocol standard, said method comprising the steps of:
receiving payload error information with said multimedia data from a Radio Link Protocol (RLP) layer; and
forwarding said payload error information with said multimedia data to a higher layer.

2. The method of claim 1, wherein said payload error information comprises a set of logical transmission unit error indicators associated with each packet.

3. The method of claim 2, wherein said error indicators point to a starting and ending location of erroneous data.

4. The method of claim 1, further comprising the step of performing a packet header cyclic redundancy check.

5. The method of claim 4, further comprising the step of forwarding said error indicator, logical transmission unit size and a packet payload to a FEC decoder if said packet header is valid.

6. The method of claim 4, further comprising the step of forwarding said error indicator and a packet payload to a FEC decoder if said packet header is valid.

7. The method of claim 1, further comprising the step of processing said payload error information to identify an erasure within each packet.

8. The method of claim 1, wherein said multimedia data has been encoded using Maximal Distance Separable codes.

9. The method of claim 8, wherein said Maximal Distance Separable codes are Reed-Solomon codes.

10. The method of claim 8, wherein said Maximal Distance Separable codes are applied to a number, k, of information packets comprised of X data units, and wherein up to X codewords are formed of length n using one data unit from each of said k information packets.

11. The method of claim 8, wherein said Maximal Distance Separable codes are applied to a number, k, of information packets comprised of X data units, and wherein up to X/L codewords of length nL are formed using L data units from each of said k information packets.

12. The method of claim 8, wherein a first set of said Maximal Distance Separable codes are applied to each of said information packets comprised of X data units to create k information packets comprised of X' data units, and a second set of said MDS codes are applied to each of said information packets comprised of X' data units, and wherein up to X' codewords are formed using one data unit from each of said k information packets.

13. The method of claim 1, wherein said payload error information includes a reformatted packet including frame error information from a lower layer.

14. The method of claim 13, further comprising the step of forwarding said reformatted packet to a FEC decoder if a cyclic redundancy check on a packet header is valid.

15. The method of claim 1, wherein said UDP layer further specifies additional packet handling procedures in accordance with a complete User Datagram Protocol.

16. A method for receiving multimedia data in a wireless packet network comprising the steps of:
processing said multimedia data to determine if said multimedia data is properly received; and
forwarding payload error information with said multimedia data, received from a Radio Link Protocol (RLP) layer, to a higher layer by a User Datagram Protocol (UDP) layer.

17. The method of claim 16, wherein said payload error information comprises a set of logical transmission unit error indicators associated with each packet.

18. The method of claim 17, wherein said error indicators point to a starting and ending location of erroneous data.

19. The method of claim 16, further comprising the step of performing a packet header cyclic redundancy check.

20. The method of claim 16, wherein said multimedia data has been encoded using Maximal Distance Separable codes.

21. The method of claim 16, wherein said payload error information includes a reformatted packet including frame error information from a lower layer.

22. The method of claim 21, further comprising the step of forwarding said reformatted packet to a FEC decoder if a cyclic redundancy check on a packet header is valid.

23. The method of claim 16, wherein said UDP layer further specifies additional packet handling procedures in accordance with a complete User Datagram Protocol.

24. A system for processing multimedia data in a User Datagram Protocol layer of a wireless receiver conforming to an Internet Protocol standard, said system comprising:
- a memory for storing computer readable code; and
- a processor operatively coupled to said memory, said processor configured to:
  - receive payload error information with said multimedia data from a Radio Link Protocol layer; and
  - forward said payload error information with said multimedia data to a higher layer.

25. The system of claim 24, wherein said payload error information comprises a set of logical transmission unit error indicators associated with each packet.

26. The system of claim 25, wherein said error indicators point to a starting and ending location of erroneous data.

27. The system of claim 24, wherein said processor is further configured to perform a packet header cyclic redundancy check.

28. The system of claim 25, wherein said processor is further configured to forward said logical transmission unit error indicators, logical transmission unit size and a packet payload to a FEC decoder if said packet header is valid.

29. The system of claim 25, wherein said processor is further configured to forward said logical transmission unit error indicators and a packet payload to a FEC decoder if said packet header is valid.

30. The system of claim 24, wherein said processor is further configured to process said payload error information to identify an erasure within each packet.

31. The system of claim 24, wherein said multimedia data has been encoded using Maximal Distance Separable codes.

32. The system of claim 31, wherein said Maximal Distance Separable codes are Reed-Solomon codes.

33. The system of claim 31, wherein said Maximal Distance Separable codes are applied to a number, k, of information packets comprised of X data units, and wherein up to X code words are formed of length n using one data unit from each of said k information packets.

34. The system of claim 31, wherein said Maximal Distance Separable codes are applied to a number, k, of information packets comprised of X data units, and wherein up to X/L code words of length nL are formed using L data units from each of said k information packets.

35. The system of claim 31, wherein a first set of said Maximal Distance Separable codes are applied to each of said information packets comprised of X data units to create k information packets comprised of X' data units, and a second set of said MDS codes are applied to of said information packets comprised of X' data units, and wherein up to X' code words are formed using one data unit from each of said k information packets.

36. The system of claim 24, wherein said payload error information includes a reformatted packet including frame error information from a lower layer.

37. The system of claim 36, wherein said processor is further configured to forward said reformatted packet to a FEC decoder if a cyclic redundancy check on a packet header is valid.

38. A system for receiving multimedia data in a wireless packet network comprising:
- a memory for storing computer readable code; and
- a processor operatively coupled to said memory, said processor configured to:
  - process said multimedia data to determine if said multimedia data is properly received; and
  - forward payload error information with said multimedia data, received from a Radio Link Protocol (RLP) layer, to a higher layer by a User Datagram Protocol (UDP) layer.

39. The system of claim 38, wherein said payload error information comprises a set of logical transmission unit error indicators associated with each packet.

40. The system of claim 39, wherein said error indicators point to a starting and ending location of erroneous data.

41. The system of claim 38, wherein said processor is further configured to perform a packet header cyclic redundancy check.

42. The system of claim 38, wherein said multimedia data has been encoded using Maximal Distance Separable codes.

43. The system of claim 38, wherein said payload error information includes a reformatted packet including frame error information from a lower layer.

44. The system of claim 43, wherein said processor is further configured to forward said reformatted packet to an FEC decoder if a cyclic redundancy check on a packet header is valid.

* * * * *

UNITED STATES PATENT AND TRADEMARK OFFICE
CERTIFICATE OF CORRECTION

| | |
|---|---|
| PATENT NO. | : 7,151,754 B1 |
| APPLICATION NO. | : 09/668242 |
| DATED | : December 19, 2006 |
| INVENTOR(S) | : Boyce et al. |

It is certified that error appears in the above-identified patent and that said Letters Patent is hereby corrected as shown below:

In the specification, column 4, line 33, that portion of the formula reading "∼mp" should read --≈mp--.

Column 5, line 16, after "S. Wenger and" and before "," replace "G. Cĉôté" with --G. Côté--.

In claim 44, column 10, line 44, after "packet to" replace "an" with --a--.

Signed and Sealed this

Second Day of December, 2008

JON W. DUDAS
*Director of the United States Patent and Trademark Office*